United States Patent [19]
Jones

[11] 4,015,150
[45] Mar. 29, 1977

[54] NORMALLY ON LED COULOMETRIC TIMING SYSTEM
[75] Inventor: John Paul Jones, Wayne, Pa.
[73] Assignee: Air Products and Chemicals, Inc., Allentown, Pa.
[22] Filed: Feb. 13, 1976
[21] Appl. No.: 658,092
[52] U.S. Cl. .............................. 307/311; 307/297; 307/293; 324/94
[51] Int. Cl.² .................... H03K 3/42; G01R 27/22
[58] Field of Search .......... 324/94, 182; 340/190.1; 317/230, 232; 307/311, 18, 29, 318, 296, 7

[56] References Cited
UNITED STATES PATENTS

| | | | |
|---|---|---|---|
| 3,090,915 | 5/1961 | Soussloff et al. | 324/94 |
| 3,355,731 | 11/1967 | Jones | 340/309.1 |
| 3,955,124 | 5/1976 | Jones | 324/94 |

Primary Examiner—Stanley D. Miller, Jr.
Assistant Examiner—B. P. Davies
Attorney, Agent, or Firm—James C. Simmons; Barry Moyerman

[57] ABSTRACT

A coulometric timing system having a source of supply with a coulometric timing circuit coupled to a cathode and an anode terminal of a coulometric cell for providing current flow for the electrolytic erosion of the anode filament. An LED is coupled in series circuit with the filament. Regulating diode means is coupled in parallel with the series circuit and to the source of supply for extinguishing the LED when the filament opens.

6 Claims, 4 Drawing Figures

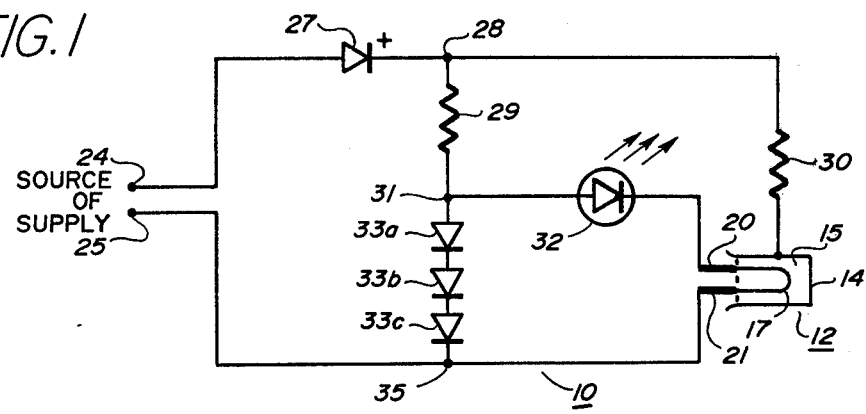
FIG. 1
FIG. 1a
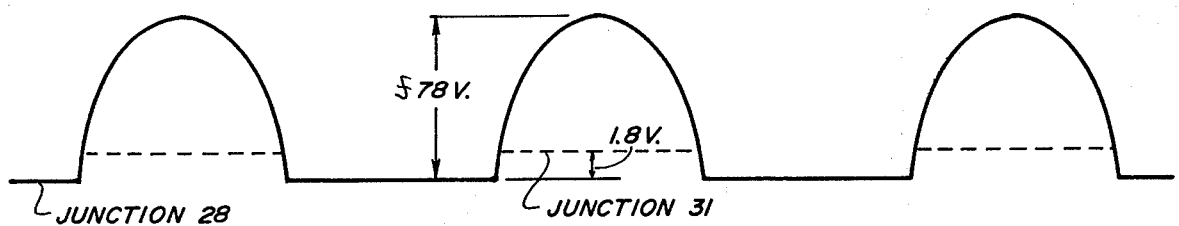
FIG. 2a
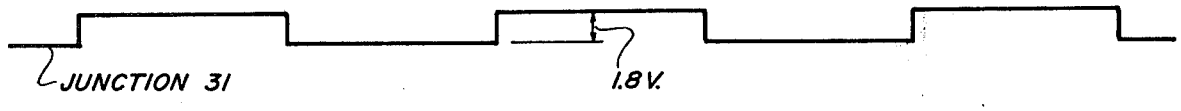
FIG. 2b
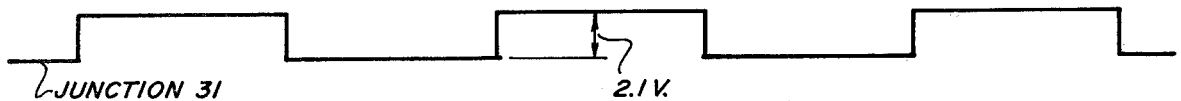
FIG. 2c

NORMALLY ON LED COULOMETRIC TIMING SYSTEM

BACKGROUND OF THE INVENTION

A. Field of the Invention

This invention relates to the field of alerting monitors and particularly coulometric timing systems.

B. Prior Art

Coulometric cells are known having a cathode cup electrode and an elongated erodable anode filament. The filament is disposed in an electrolyte solution and a current is provided which flows through the cell and provides for electrolytic erosion of the anode filament. When the filament initially opens due to this electrolytic erosion, it has a relatively low resistance which resistance increases in time. Such coulometric cells are described for example in U.S. Pat. Nos. 3,355,731; 3,711,751; and 3,769,557. In many timing applications, it has been required that the timing system be of very low cost and of small size as well as highly reliable in the presence of environmental conditions such as humidity and dust or changes in ambient temperature.

In some timing applications, the coulometric cell has been used with a light emitting diode (LED) where the LED is turned on and illuminates at the time the anode filament initially opens as set forth in my copending patent application for Improved Coulometrically Timed Indicator Lamp Circuits Operable From High Voltages, Ser. No. 658,091 filed Feb. 13, 1976 now U.S. Pat. No. 3,999,088. However, the foregoing application has not provided for the LED being a "normally on" indicator and thus be illuminated during the timing or calibration period and become extinguished or turned off at the end of the timing period when the anode filament opens.

SUMMARY OF THE INVENTION

A coulometric timing system comprising a source of supply with a coulometric timing circuit which is coupled to a cathode electrode and an anode electrode of a coulometric cell. The cell has an elongated erodable anode filament coupled between two anode terminals and disposed in an electrolyte solution. An LED is coupled in series circuit with a filament. Regulating diode means is coupled in parallel with the series circuit and to the source of supply so that when the filament opens the LED is extinguished due to the potential across the LED falling below its illumination threshold voltage.

BRIEF DESCRIPTION OF THE DRAWINGS

FIG. 1 illustrates in schematic form a normally on LED coulometric timing system in accordance with the invention; and FIGS. 2A–C illustrate waveforms which are helpful in understanding the operation of FIG. 1.

DETAILED DESCRIPTION

Referring now to FIG. 1, there is shown a normally on light emitting diode (LED) alerting monitor 10 timed by a coulometric cell 12. Coulometric cell 12 is generally described in U.S. Pat. Nos. 3,355,731; 3,711,751; and 3,769,557 and in my copending U.S. patent application cited above.

Cell 12 comprises a copper cup electrode or cathode electrode 14, electrolyte solution 15, an anode filament 17 and a pair of anode terminals 20, 21. When a predetermined potential is applied between anode terminal 21 and cathode 14, metal is plated away from the filament onto the cathode. By precisely selecting the dimensions and surface area of filament 17, the exact time of rupture or opening of the filament and of the conductive path between terminals 20 and 21 may be controlled. In FIG. 1A, there is shown an example of the gap at the time of initial opening of filament 17 when the resistance between terminals 20 and 21 may be approximately 100 ohms. This substantially low resistance increases with time or "ages" and the resistance across terminals 20, 21 slowly increases until it reaches values in the area of 10,000 ohms or more.

Timing system 10 includes a source of supply coupled to input terminals 24, 25. The source of supply may be a high voltage AC source of 110 volts AC or a DC source, though for the purpose of explanation, an AC source may be assumed to be connected to the input terminals. Terminal 24 is coupled through a diode 27 to a junction 28 with the diode rectifying AC and preventing incorrect polarity connection of a DC source. Junction 28 is connected to one end of a limiting resistor 29 and one end of a calibration or timing resistor 30. The other end of resistor 30 is coupled to cathode 14 while the other end of resistor 29 is coupled through junction 31, and LED 32 to anode terminal 20. Anode terminal 21 is coupled through junction 35 to input terminal 25. Further, series connected regulating diodes 33a–c are coupled between terminals 31 and 35 and are thus in parallel with the series circuit of LED 32 and filament 17.

The coulometric current or current provided for th electrolytic erosion of filament 17 may be traced from junction 28 through resistor 30, cathode 14, electrolyte 15, filament 17, terminal 21, junction 35, and then to terminal 25. Accordingly, as long as a source of supply is coupled to terminals 24 and 25, electrolytic erosion takes place in filament 17.

As shown by the waveform of FIG. 2A, diode 27 produces a halfwave rectified potential at junction 28 and current flow may be traced from junction 28 through a resistor 29, junction 31, LED 32, filament 17 to junction 35. It will be understood that during timeout, with filament 17 unbroken that the potential between junction 31 and 35 is substantially 1.8 volts as shown in FIGS. 2A–B. The reason for this is that LED 32 has a lower threshold of conduction than the three series diodes 33a–c which have a threshold of very close to 2.1 volts. Accordingly, LED 32 conducts while diodes 33a–c are nonconductive during timeout.

After timeout, at the time that filament 17 opens or ruptures as a result of electrolytic erosion, the initial resistance between terminals 20, 21 may be approximately 100 ohms. This resistance increases slowly over time due to further electrolytic erosion of filament section 17a since the electrolytic circuit is maintained between filament terminal 21 and cathode cup 14.

It will be understood that upon opening of filament 17, the potential at junction 31 jumps towards 2.1 volts corresponding to the clamp voltage of diodes 33a–c. This occurs because the potential drop across the open filament 17 is of sufficient relative value and thus LED 32 is effectively deprived or starved of its illumination threshold voltage. In this way, as shown in FIG. 2C, LED 32 immediately extinguishes and stays extinguished upon the opening of filament 17 due to the potential across the LED falling below its threshold.

After diodes 33a–c begin to conduct, they tend to remain a constant voltage device in the forward direction. The threshold of conduction for the three diodes 33a–c remains 2.1 volts as shown in FIG. 2C. These diodes change internal resistance to regulate the voltage drop across them in the forward direction.

It will be understood that light emitting diodes of various colors may be used in place of LED 32 and may have differing voltage drops such as 2.2 volts. In such cases, diodes 33a–c may comprise four diodes in series. Alternatively, the regulating diodes may comprise a single Zener diode of appropriate drop. However, it is usually quite difficult to obtain Zener diodes having a 2.1 volt drop and Zener diodes do not normally have the sharp curve cutoff provided by diodes 33a–c, in a series circuit, in the very low voltage ranges.

What is claimed is:

1. A coulometric timing system comprising
 a DC source of supply,
 a coulometric cell having a cathode electrode and an elongated erodable anode filament coupled between two anode terminals and disposed in an electrolyte solution, the resistance between said anode terminals being substantially low at the time said filament initially opens due to electrolytic erosion whereby said resistance increases with time,
 coulometric timing circuit means coupled to said cathode electrode, an anode terminal and said source of supply for providing current flow for said electrolytic erosion of said filament,
 a light emitting diode indicator coupled in series circuit with said filament,
 constant voltage clamping diode means coupled in parallel circuit with said series circuit and also coupled in parallel circuit with said DC source for providing a substantially constant voltage thereacross only when said diode means conducts, said constant voltage diode means being (1) normally non-conductive with said filament unbroken and said light emitting diode conducting and illuminating and (2) conductive and providing a substantially constant voltage with said filament open initially and thereafter for extinguishing said light emitting diode.

2. The coulometric timing system of claim 1 in which said constant voltage diode means is selected to provide a predetermined value of constant potential of magnitude so that the potential drop across said initially open filament is of sufficient relative value to deprive said light emitting diode of its illumination threshold voltage.

3. The coulometric timing system of claim 2 in which said constant voltage diode means comprises at least three diodes connected in series circuit to provide said substantially constant potential.

4. The coulometric timing system of claim 3 in which said coulometric timing circuit means includes a calibration resistor coupled between said DC source of supply and said cathode electrode and not directly coupled to said anode filament whereby current flow for electrolytic erosion flows through said calibration resistor, said cathode electrode, said electrolyte solution, said one anode terminal and thence to said source of supply.

5. The coulometric timing system of claim 4 in which there is provided a limiting resistor coupled between said source of supply and said parallel circuit for limiting the flow of current through said parallel circuit.

6. The coulometric timing system of claim 5 in which said DC source of supply includes an AC supply and a diode coupled to one side of said calibration resistor and said limiting resistor for rectifying said AC supply to produce said DC.

* * * * *